United States Patent
Yoon et al.

(10) Patent No.: US 7,535,520 B2
(45) Date of Patent: May 19, 2009

(54) THIN FILM TRANSISTOR ARRAY PANEL FOR LIQUID CRYSTAL DISPLAY

(75) Inventors: Joo-Sun Yoon, Seoul (KR); Seok-Je Seong, Yongin-si (KR); Jin-Suk Park, Seoul (KR)

(73) Assignee: Samsung Electronics, Co., Ltd., Gyeonggi-do (KR)

( * ) Notice: Subject to any disclaimer, the term of this patent is extended or adjusted under 35 U.S.C. 154(b) by 351 days.

(21) Appl. No.: 11/543,970

(22) Filed: Oct. 4, 2006

(65) Prior Publication Data
US 2007/0103614 A1     May 10, 2007

(30) Foreign Application Priority Data
Nov. 7, 2005     (KR) ............... 10-2005-0105939

(51) Int. Cl.
G02F 1/136     (2006.01)
G02F 1/1343     (2006.01)

(52) U.S. Cl. ............... 349/43; 349/38; 349/39

(58) Field of Classification Search ........... 349/38–39
See application file for complete search history.

(56) References Cited

U.S. PATENT DOCUMENTS

| | | | | |
|---|---|---|---|---|
| 4,582,395 A | * | 4/1986 | Morozumi ............... | 349/43 |
| 5,162,933 A | * | 11/1992 | Kakuda et al. ............ | 349/46 |
| 2003/0202149 A1 | * | 10/2003 | Miyajima et al. ......... | 349/149 |
| 2006/0119753 A1 | * | 6/2006 | Luo et al. .................. | 349/38 |

FOREIGN PATENT DOCUMENTS
JP     10-173191     6/1998
(Continued)

OTHER PUBLICATIONS
Patent Abstracts of Japan, Publication No. 10-173191, Jun. 26, 1998, 1 page.
(Continued)

*Primary Examiner*—Michelle R. Connelly-Cushwa
*Assistant Examiner*—Chris Chu
(74) *Attorney, Agent, or Firm*—Haynes and Boone, LLP

(57) ABSTRACT

A thin film transistor array panel includes an insulation substrate having a display area and a peripheral area, a gate line formed on the insulation substrate, a first capacitor conductor made of the same material as the gate line and formed in the peripheral area of the insulation substrate, a gate insulating layer formed on the gate line and the first capacitor conductor, a semiconductor layer formed on the gate insulating layer, a data line and a drain electrode formed on the semiconductor layer and formed in the display area of the insulation substrate, a second capacitor conductor formed of the same material as the data line and formed in the peripheral area of the insulation substrate, and a pixel electrode connected to the drain electrode. The first capacitor conductor and the second capacitor conductor overlap each other. Since the driving capacitor that has been formed on the FPC substrate in the prior art is formed in a peripheral area of the thin film transistor array panel, the FPC can be formed as one layer and a size of the FPC can be substantially reduced and thereby a slim and small-sized liquid crystal display can be produced.

23 Claims, 20 Drawing Sheets

FOREIGN PATENT DOCUMENTS

| | | |
|---|---|---|
| JP | 2000-098428 | 4/2000 |
| JP | 2000-208773 | 7/2000 |
| JP | 2001-223365 | 8/2001 |
| JP | 2004-317748 | 11/2004 |
| KR | 1020000014689 | 3/2000 |
| KR | 1020010017848 | 3/2001 |
| KR | 1020020006371 | 1/2002 |
| KR | 1020030033241 | 5/2003 |
| KR | 1020040062192 | 7/2004 |
| KR | 1020050003515 | 1/2005 |
| KR | 1020050014980 | 2/2005 |
| KR | 1020050024147 | 3/2005 |

OTHER PUBLICATIONS

Patent Abstracts of Japan, Publication No. 2000-098428, Apr. 7, 2000, 1 page.
Patent Abstracts of Japan, Publication No. 2000-208773, Jul. 28, 2000, 1 page.
Patent Abstracts of Japan, Publication No. 2001-223365, Aug. 17, 2001, 1 page.
Patent Abstracts of Japan, Publication No. 2004-317748, Nov. 11, 2004, 1 page.
Patent Abstracts of Korea, Publication NO. 1020000014689 A, Mar. 15, 2000, 1 page.
Patent Abstracts of Korea, Publication No. 1020010017848 A, Mar. 5, 2001, 1 page.
Patent Abstracts of Korea, Publication No. 1020020006371 A, Jan. 19, 2002, 1 page.
Patent Abstracts of Korea, Publication No. 1020030033241 A, May 2001, 1 page.
Patent Abstracts of Korea, Publication No. 1020040062192 A, Jul. 7, 2004, 1 page.
Patent Abstracts of Korea, Publication No. 1020050003515 A, Jan. 12, 2005, 1 page.
Patent Abstracts of Korea, Publication No. 1020050014980 A, Feb. 21, 2005, 1 page.
Patent Abstracts of Korea, Publication No. 1020050024147 A, Mar. 10, 2005, 1 page.

* cited by examiner

THIN FILM TRANSISTOR ARRAY PANEL FOR LIQUID CRYSTAL DISPLAY

CROSS-REFERENCE TO RELATED APPLICATION

This application claims priority to and the benefit of Korean Patent Application No. 10-2005-0105939 filed in the Korean Intellectual Property Office on Nov. 07, 2005, the contents of which are incorporated herein by reference.

FIELD OF THE INVENTION

The present invention relates to a thin film transistor array panel.

DESCRIPTION OF THE RELATED ART

A liquid crystal display is one type of widely used flat panel displays. A liquid crystal display includes two display panels provided with field generating electrodes. Voltages representing image data signals are applied to the electrodes and rearrange the molecules of a liquid crystal layer interposed between the panels thereby regulating the transmittance of light passing through the liquid crystal layer.

A plurality of gate and data FPC (flexible printed circuit) substrates are typically attached to the display panel unit and a printed circuit board (PCB) is attached to the gate and data FPC substrates which may be made of made of polyimide, polyester, etc. A gate driver IC (integrated circuit) and a data driver IC are mounted to the gate and the data FPC substrates, respectively.

However, the thickness of the liquid crystal display is substantially increased by the IC chip or the driving capacitor mounted on the gate and data FPC substrates. In addition, as the number of IC chips or capacitors is increased, the size of the gate and data FPCs increases, increasing the size as well as the manufacturing cost of the liquid crystal display.

SUMMARY OF THE INVENTION

The present invention provides a thin film transistor array panel in which a driving capacitor mounted to gate and data flexible printed circuits is formed in a display panel unit by a gate line and a data line that overlap each other. More particularly, in accordance with the present invention, the driving capacitor which, in the prior art, was formed on the FPC substrate is formed in a peripheral area of the thin film transistor array panel so that the size of the FPC can be substantially reduced so a slim and small-sized liquid crystal display can be produced. An exemplary embodiment of the present invention provides a thin film transistor array panel including an insulation substrate having a display area and a peripheral area, a gate line formed on the insulation substrate, a first capacitor having a conductor made of the same material as the gate line and formed in the peripheral area of the insulation substrate, a gate insulating layer formed on the gate line and the first capacitor conductor, a semiconductor layer formed on the gate insulating layer, a data conductor and a drain electrode formed on the semiconductor layer and formed in the display area of the insulation substrate, a second capacitor conductor formed of the same material as the data line and formed in the peripheral area of the insulation substrate, and a pixel electrode connected to the drain electrode. The first capacitor conductor and the second capacitor conductor overlap each other.

The thin film transistor array panel according to an ohmic contact between the semiconductor layer and a first capacitor conductor on an insulation substrate including a display area and a peripheral area; forming a gate insulating layer on the gate line and the first capacitor conductor; forming a semiconductor layer on the gate insulating layer; forming a data line, a drain electrode, and a second capacitor conductor on the semiconductor layer; and forming a pixel electrode connected to the drain electrode. The first capacitor conductor and the second capacitor conductor formed in the peripheral area of the insulation substrate overlap each other.

The forming of the gate line and the first capacitor conductor includes sequentially depositing a lower layer, an intermediate layer, and an upper layer on the insulation substrate; performing first etching on the upper layer and the intermediate layer; performing second etching on the lower layer; and performing a third etching on the upper layer and the intermediate layer such that widths of the upper layer and the intermediate layer become narrower than the width of the lower layer.

BRIEF DESCRIPTION OF THE DRAWINGS

The foregoing and other objects and features of the present invention may become more apparent from a reading of the ensuing description, together with the drawing, in which.

DETAILED DESCRIPTION OF THE EMBODIMENTS

Figure 1:
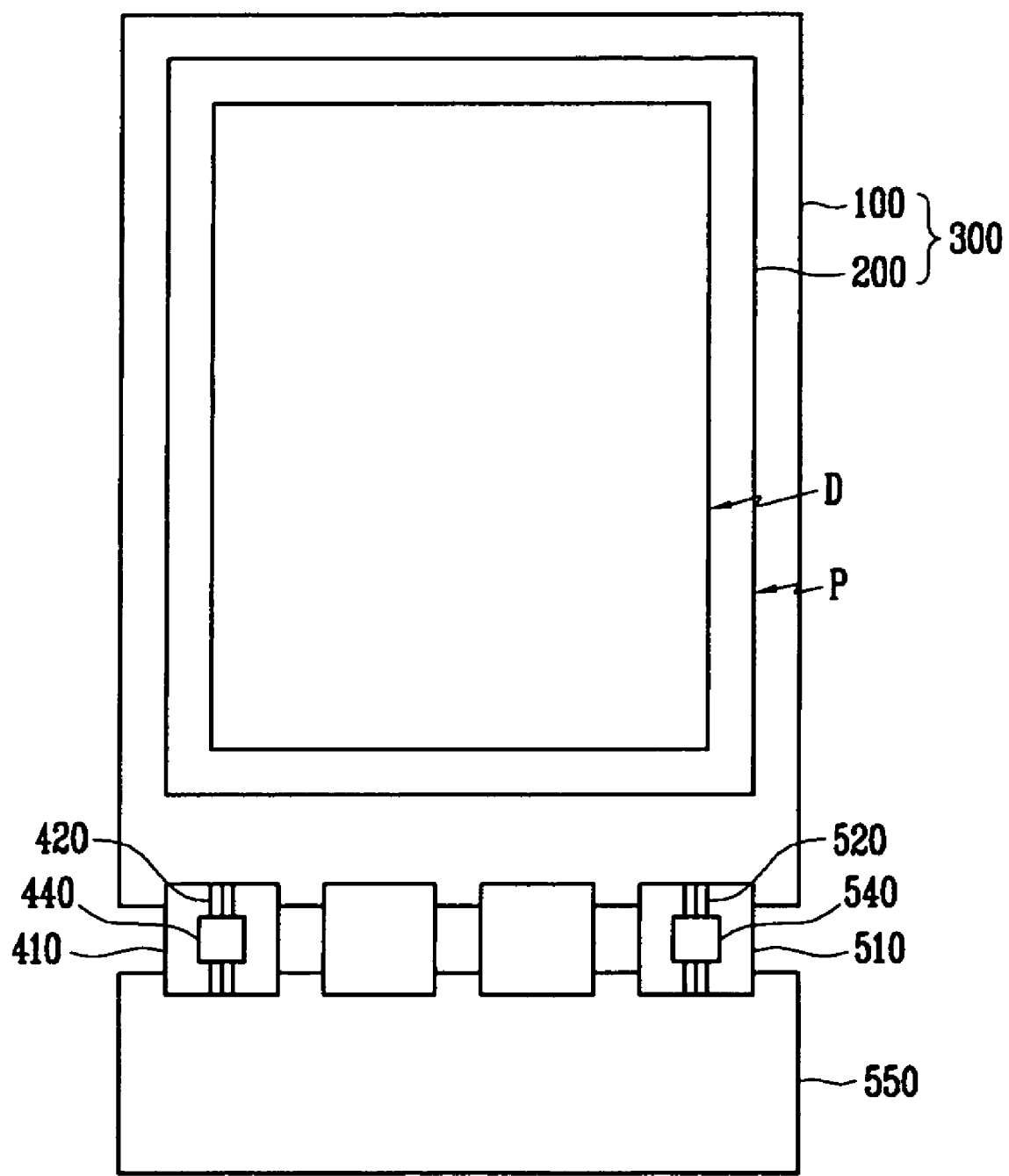
FIG. 1 is a schematic diagram of a liquid crystal display according to an exemplary embodiment of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As shown in FIG. 1, a liquid crystal display according to an exemplary embodiment of the present invention includes a display panel unit 300 consisting of a lower panel 100 and an upper panel 200, a plurality of gate FPC substrates 410 and a plurality of data FPC substrates 510 attached thereto, and a printed circuit board (PCB) 550 attached to the gate and data FPC substrates 410 and 510.

A gate driver IC 440 and a data driver IC 540 are respectively mounted on the gate FPC substrate 410 and the data FPC substrate 510 and connection lines 420 and 520 for electrical connection between the driver ICs 440 and 540 to an external part are formed. FPC substrates 410 and 510 may be made of polyimide, polyester, or the like.

Printed circuit board (PCB) 550 is provided with various circuit elements for driving and controlling the display panel unit 300. Alternatively, the driver ICs 440 and 550 may be mounted directly on the lower panel 100 of the display panel unit 300 and, in this case, the gate FPC substrate 410 can be omitted.

Lower panel 100 of the display panel unit 300 can be divided into a display area D for displaying images and a peripheral area P disposed around the display area D and physically or electrically connecting display signal lines (not shown) within the display area to the FPC substrates 410 and 510 or the driver ICs 440 and 540.

Figure 2:
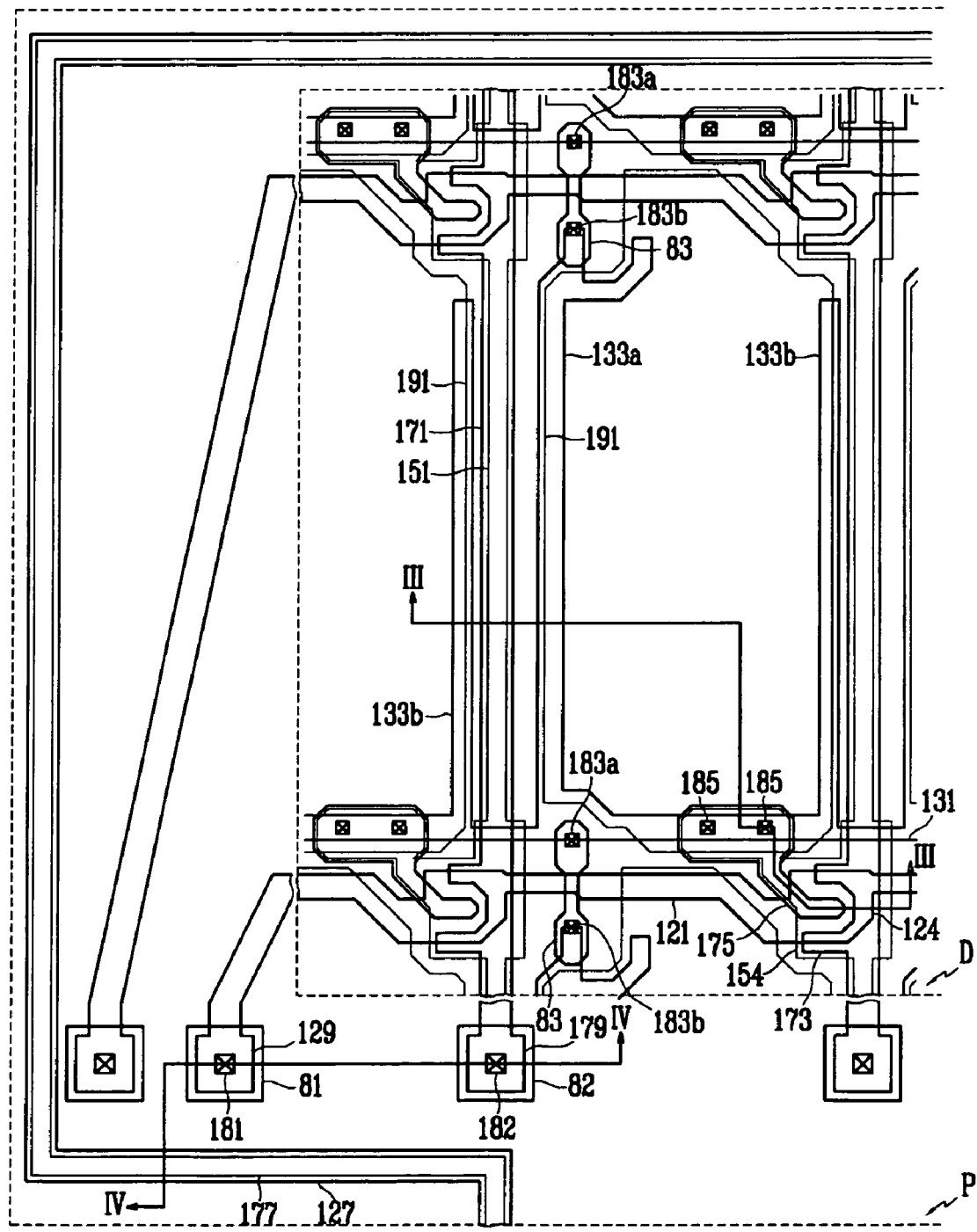
FIG. 2 is a layout view of a thin film transistor array panel for a liquid crystal display according to an exemplary embodiment of the present invention.
Figure 3:
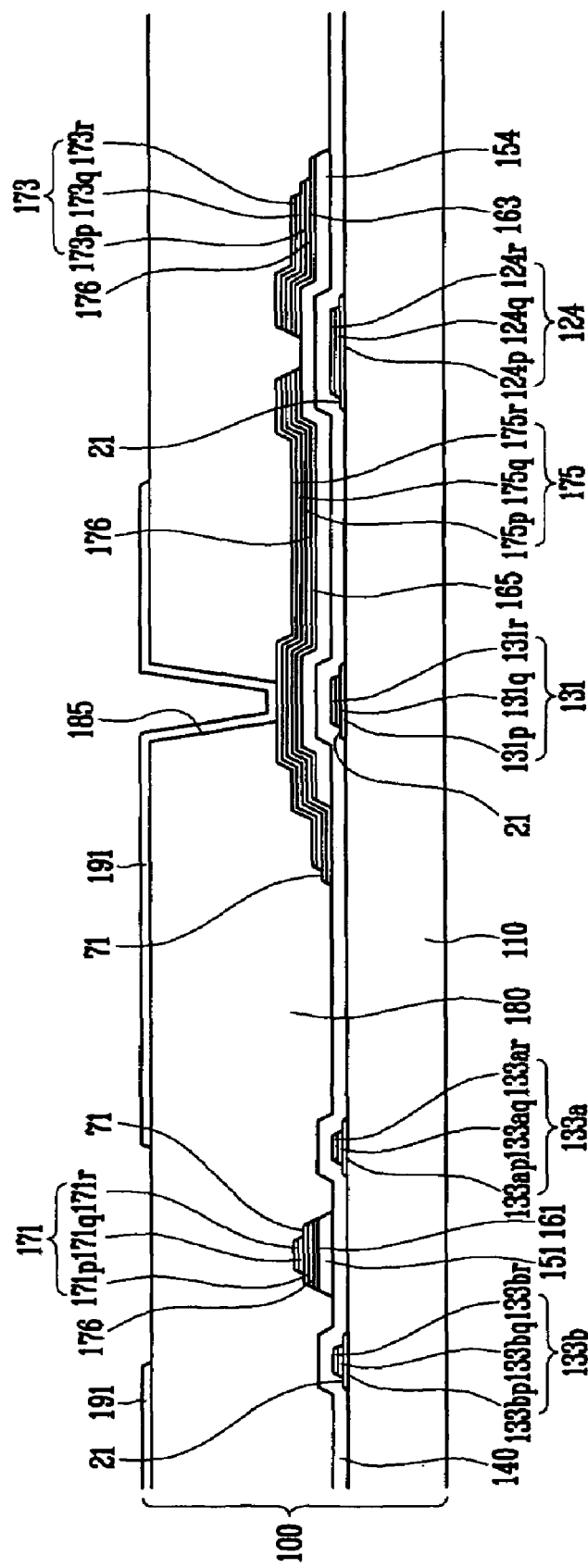
FIG. 3 and FIG. 4 are cross-sectional views of the thin film transistor array panel taken along a line III-III and a line IV-IV of FIG. 2, respectively.
Figure 4:
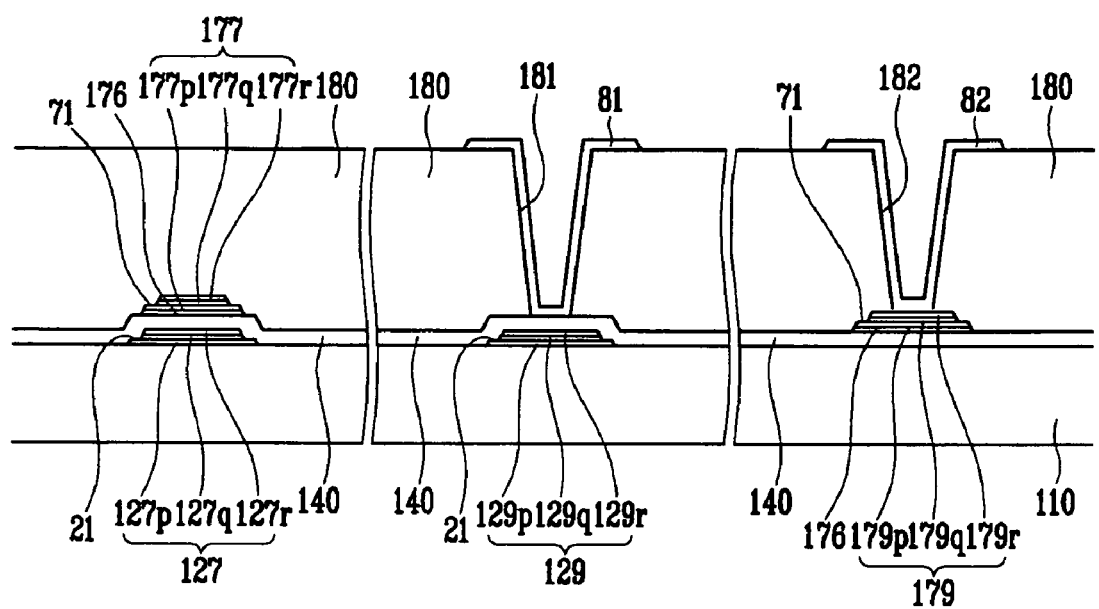

Referring to FIG. 2 to FIG. 4, a thin film transistor array panel 100 for a liquid crystal display, i.e., the lower panel 100, will be explained in detail. FIG. 2 is a layout view of a thin film transistor array panel for a liquid crystal display according to an exemplary embodiment of the present invention, and FIG. 3 and FIG. 4 are cross-sectional views of the thin film transistor array panel taken along a line III-III and a line IV-IV of FIG. 2.

On an insulation substrate 110 that is made of transparent glass or plastic, etc., a plurality of gate lines 121, a plurality of storage electrode lines 131, and a plurality of first capacitor conductors 127 that are display signal lines are formed.

Gate lines 121 transmit gate signals and generally extend in a horizontal direction. Each of gate lines 121 includes a plurality of gate electrodes 124 protruding downwardly and an end portion 129 that is enlarged so as to have wide area for a connection to other layers or an external driving circuit. The gate driver IC 440 for generating gate signals is mounted on the gate FPC substrate 410 attached to the substrate 110.

A predetermined voltage is applied to the storage electrode lines 131, each of which includes a stem line extending substantially parallel with the gate line 121 and a plurality of pairs of first and second storage electrodes 133a and 133b branched therefrom. Each of the storage electrode lines 131 is disposed between two neighboring gate lines 121, and is disposed to be nearer to the lower of the two gate lines 121. Each of the storage electrodes 133a and 133b has a fixed end connected to the stem line and a free end opposite thereto. An area of the fixed end of the first storage electrode 133a is relatively wide, and the free end thereof is branched into two portions, i.e., a linear portion and a bent portion. However, the shape and disposition of the storage electrode lines 131 can be variously modified.

The first capacitor conductors 127 are formed in the peripheral area P such that they are connected to the driver ICs 440 and 540, and are formed along an edge portion of the display area D. The shape of the first capacitor conductors 127 can be variously modified.

Gate lines 121, the storage electrode lines 131, and the first capacitor conductors 127 have triple-layer structures including a lower layer, an intermediate layer, and an upper layer.

The lower layer is made of a metal having low resistivity, for example an aluminum group metal such as aluminum (Al) or an aluminum alloy, a silver group metal such as silver (Ag) or a silver alloy, or copper group metal such as copper (Cu) or a copper alloy, so as to reduce signal delay and voltage drop. The intermediate layer is made of a material or metal having excellent physical, chemical, and electrical contact characteristics with ITO (indium tin oxide) or IZO (indium zinc oxide), for example chromium (Cr), titanium (Ti), a molybdenum group metal such as molybdenum (Mo) and a molybdenum alloy, tantalum (Ta), or the like. The upper layer is made of a nitride of the intermediate layer, i.e., chromium nitride (CrNx), titanium nitride (TiNx), molybdenum nitride (MoNx), molybdenum-tungsten nitride (MoWNx), or the like, so as to reduce contact resistance with the intermediate layer. The upper layer is formed to be quite thin so as to lower the energy barrier with the intermediate layer and thereby lowering the contact resistance with the intermediate layer.

As an example of the triple-layer structure, there may be a lower aluminum (alloy) layer, an intermediate chromium layer, and an upper chromium nitride layer.

In FIG. 3 and FIG. 4, the lower layer, the intermediate layer, and the upper layers of the gate electrode 124, the end portion 129 of the gate line, the storage electrode line 131, the storage electrodes 133a and 133b, and the first capacitor conductor 127 are designated by the alphabetic characters p, q, and r appended to their respective reference numerals.

Side surfaces of the gate line 121, the storage electrode line 131, and the first capacitor conductor 127 are slanted with respect to a surface of the substrate 110, preferably by about 30 to 80 degrees. In addition, portions of sides of the upper layer and the intermediate layer of the gate electrodes 124, the storage electrode lines 131, the storage electrodes 133a and 133b, the first capacitor conductors 127, and the end portions 129 of gate lines are removed so that portions 21 of the lower layers 124p, 131p, 133ap, 133bp, 127p, and 129p are exposed.

A gate insulating layer 140, which is made of silicon nitride (SiNx), silicon oxide (SiOx), or the like, is formed on gate lines 121 and the storage electrode lines 131.

A plurality of semiconductor stripes 151, made of hydrogenated amorphous silicon (amorphous silicon is simply referred to as a-Si), polysilicon, or the like, are formed on gate insulating layer 140. Each semiconductor stripe 151 generally extends in a vertical direction, and includes a plurality of protrusions 154 extending toward gate electrode 124. The width of semiconductor stripe 151 is wider near gate line 121 and storage electrode line 131 so as to cover these parts.

A plurality of ohmic contact stripes and islands 161 and 165 are formed on semiconductor 151. Ohmic contacts 161 and 165 may be made of a material such as n+ hydrogenated amorphous silicon in which an n-type impurity such as phosphor is doped at a high concentration, or silicide. Ohmic contact stripe 161 includes a plurality of protrusions 163. Protrusion 163 and ohmic contact island 165 are disposed on protrusion 154 of semiconductor 151.

Side surfaces of the semiconductors 151 and the ohmic contacts 161 and 165 are also slanted with respect to a surface of the substrate 110, by about 30 to 80 degrees.

On the ohmic contacts 161 and 165 and the gate insulating layer 140, a plurality of data lines 171, a plurality of drain electrodes 175, and a plurality of second capacitor conductors 177, which are display signal lines, are formed.

Data lines 171 transmit data signals, and generally extend in a vertical direction so as to cross gate lines 121. Each of data lines 171 crosses a storage electrode line 131 and runs between sets of neighboring storage electrodes 133a and 133b. Each of data lines 171 includes a plurality of source electrodes 173 extending toward gate electrode 124 to be bent in a shape of a J, and an end portion 179 having a wide area for connection to another layer or an external driving circuit.

The data driver IC 540 for generating data signals is mounted on the data FPC substrate 510 attached to the substrate 110.

Each drain electrode 175 is separated from a data line 171 and is opposite to a source electrode 173 centering around gate electrode 124. Each of the drain electrodes 175 includes a wide end portion and, at the other end, a portion having a bar shape. The wide end portion overlaps the storage electrode line 131, and the other end portion in a bar shape is partially surrounded by the bent source electrode 173.

One gate electrode 124, one source electrode 173, and one drain electrode 175 form one thin film transistor TFT together with protrusion 154 of semiconductor 151. The channel of the thin film transistor is formed on the protrusion 154 between the source electrode 173 and the drain electrode 175.

The second capacitor conductor 177 is formed in the peripheral area P to overlap the first capacitor conductor 127, and is formed along an edge portion of the display area D. The first and second capacitor conductors 127 and 177 form a driving capacitor so as to perform functions such as buffering or storing signals transmitted to the driver ICs 440 and 540 from the printed circuit board PCB 550.

The data line 171, the drain electrode 175, and the second capacitor conductor 177 have a triple-layer structure including lower layers 171p, 175p, and 177p, intermediate layers 171q, 175q, and 177q, and upper layers 171r, 175r, and 177r.

The lower layers 171p, 175p, and 177p are made of a metal having low resistivity, for example an aluminum group metal such as aluminum (Al) or an aluminum alloy, a silver group metal such as silver (Ag) or a silver alloy, or a copper group metal such as copper (Cu) or a copper alloy, so as to reduce a signal delay or a voltage drop. The intermediate layers 171q, 175q, and 177q are made of a material or metal having excellent physical, chemical, and electrical contact characteristics with ITO (indium tin oxide) or IZO (indium zinc oxide), for example chromium (Cr), titanium (Ti), a molybdenum group metal such as molybdenum (Mo) and a molybdenum alloy, tantalum (Ta), or the like. The upper layers 171r, 175r, and 177r are made of a nitride of the intermediate layer, i.e., chromium nitride (CrNx), titanium nitride (TiNx), molybdenum nitride (MoNx), molybdenum-tungsten nitride (MoWNx), or the like, so as to reduce contact resistance of the intermediate layer.

As an example of the triple-layer structure, there may be a lower aluminum (alloy) layer, an intermediate chromium layer, and an upper chromium nitride layer.

In FIG. 3 and FIG. 4, for the source electrode 173 and the end portion 179 of the data line, the lower layer, the intermediate layer, and the upper layer thereof are designated by adding alphabetic characters p, q, and r to their own reference numerals, respectively.

By forming the first capacitor conductor 127 and the second capacitor conductor 177 with the lower layer of an aluminum alloy, the intermediate layer of chromium, and the upper layer of chromium nitride, line resistances of the first capacitor conductor 127 and the second capacitor conductor 177 become lower so that voltage boosting efficiency in a DC-DC converter is improved. In addition, since the line resistances of the first capacitor conductor 127 and the second capacitor conductor 177 are low, the voltage difference between a gate-on voltage and a gate-off voltage is constantly maintained.

Side surfaces of the data line 171, the drain electrode 175, and the second capacitor conductor 177 may be slanted by about 30 to 80 degrees with respect to a surface of the substrate 110.

Sides of the upper layer and the intermediate layer of the data line 171, the drain electrode 175, and the second capacitor conductor 177 are partially removed so that portions 71 of the lower layers 171p, 173p, 175p, 177p, and 179p are exposed.

A buffer layer 176 is formed between the lower layers 171p, 173p, and 175p of the data line 171, the source electrode 173, and drain electrode 175 and the ohmic contacts 161, 163, and 165. Accordingly, damage to the ohmic contact 151 by the lower layers 171p, 173p, and 175p, which are made of aluminum group metal having characteristics of poor adhesion to other layers and easily diffusing to other layers, can be prevented, and the contact resistance therebetween can be reduced.

Buffer layer 176 is also formed between the end portion of the data line and the lower layers 179p and 177p of the second capacitor conductor 177 and the gate insulating layer 140.

Buffer layer 176 is made of a material or metal having excellent physical, chemical, and electrical contact characteristics, for example molybdenum (Mo), molybdenum tungsten (MoW), titanium (Ti), tungsten (W), nitrides MoNx, MoWNx, TiNx, and WNx thereof, and the like. In addition, the buffer layer 176 can be made of a lower layer of molybdenum and an upper layer of a nitride thereof, or a lower layer of molybdenum tungsten and an upper layer of a nitride thereof.

Ohmic contacts 161 and 165 only exist between the semiconductor 151 below and the data line 171 above and the drain electrode 175 above, and lowers contact resistance between them. Although the semiconductor stripe 151 is narrower than the data line 171 for the most part, as described above, the semiconductor stripe 151 becomes wider at a portion where it meets the gate line 121, so that the surface profile becomes smooth thereby preventing the data line 171 from being cut. Semiconductor 151 has portions that are exposed without being covered by the data line 171 and the drain electrode 175, including a region between the source electrode 173 and the drain electrode 175.

A passivation layer 180 is formed on the data line 171, the drain electrode 175, the second capacitor conductor 177, and the exposed portion of the semiconductor 151. Passivation layer 180 may be made of an inorganic insulator, an organic insulator, or the like, and may have a flat surface.

Silicon nitride and silicon oxide may be examples of the inorganic insulator. The organic insulator may have photosensitivity, and a dielectric constant thereof may be less than or equal to about 4.0. However, so as to prevent the exposed portion of the semiconductor 151 from being damaged while maintaining the excellent insulating characteristic of the organic layer, the passivation layer 180 may have a double-layer structure of a lower inorganic layer and an upper organic layer.

A plurality of contact holes 182 and 185 respectively exposing the end portion 179 of the data line 171 and the drain electrode 175 are formed in passivation layer 180. A plurality of contact holes 181 exposing the end portion 129 of the gate line 121, a plurality of contact holes 183a exposing a portion of the storage electrode line 131 near the fixed end of the first storage electrode 133a, and a plurality of contact holes 183b exposing the protrusion of the free end of the first storage electrode 133a are formed in the passivation layer 180 and the gate insulating layer 140.

A plurality of pixel electrodes 191, a plurality of overpasses 83, and a plurality of contact assistants 81 and 82 are formed on the passivation layer 180. These members may be made of a transparent conductive material such as ITO or IZO, or a reflective metal such as aluminum, silver, chromium, or alloys thereof.

Each pixel electrode 191 is physically and electrically connected to a drain electrode 175 through a contact hole 185, and a data voltage is applied to the pixel electrode 191 from the drain electrode 175. The pixel electrodes 191 are applied with the data voltage to generate an electric field together with a common electrode (not shown) of the other display panel 200 to which a common voltage is applied, and thereby determines an orientation of liquid crystal molecules (not shown) of a liquid crystal layer (not shown) between the two electrodes. The polarization of light passing the liquid crystal layer changes according to the orientation of the liquid crystal molecules determined as such. A pixel electrode 191 and the common electrode form a capacitor (hereinafter referred to as a liquid crystal capacitor) to thereby maintain the applied voltage even after the thin film transistor is turned off.

A pixel electrode 191 and a drain electrode 175 connected thereto overlap the storage electrodes 133a and 133b and a storage electrode line 131, and left and right sides of the pixel electrode 191 are closer to the data line 171 than to the storage electrodes 133a and 133b. Pixel electrode 191 and drain electrode 175 electrically connected thereto overlap a storage electrode line 131 to thereby form a capacitor, and this capacitor is referred to as a storage capacitor. The storage capacitor strengthens the voltage maintaining capacity of the liquid crystal capacitor.

Contact assistants 81 and 82 are respectively connected to the end portion 129 of gate line 121 and the end portion 179 of data line 171 through contact holes 181 and 182. Contact assistants 81 and 82 complement the adhesive property of the end portion 129 of the gate line 121 and the end portion 179 of the data line to an external device, and protect these members.

Each overpass 83 crosses a gate line 121, and is connected to the exposed portion of a storage electrode line 131 and the exposed end portion of the free end of a storage electrode 133b through the contact holes 183a and 183b that are disposed to be opposite to each other with the gate line 121 interposed therebetween. Storage electrodes 133a and 133b and the storage electrode lines 131 can be used to fix faults of gate lines 121, data lines 171, or the thin film transistors together with the overpasses 83.

A method of manufacturing the thin film transistor array panel according to an exemplary embodiment of the present invention as shown in FIG. 1 to FIG. 4 will now be explained in detail with reference to FIG. 5 to FIG. 20.

Figure 8:
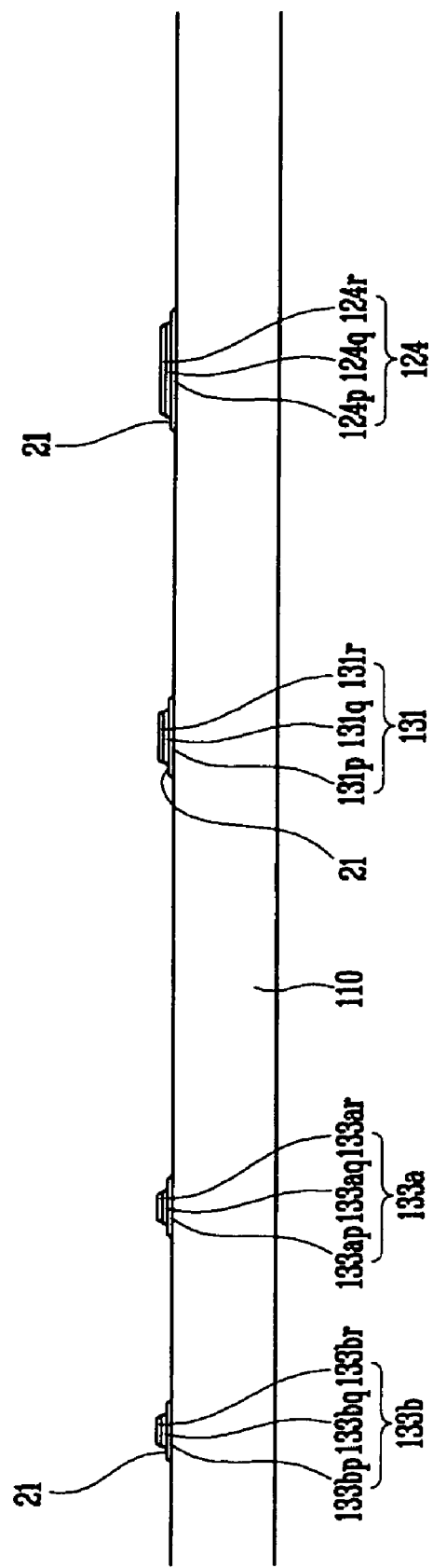
FIG. 8 and FIG. 9 are cross-sectional views of steps subsequent to FIG. 5 and FIG. 7, respectively.
Figure 9:
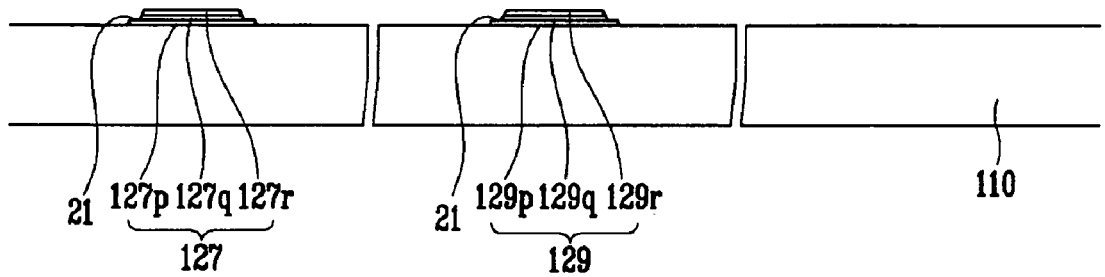
Figure 16:
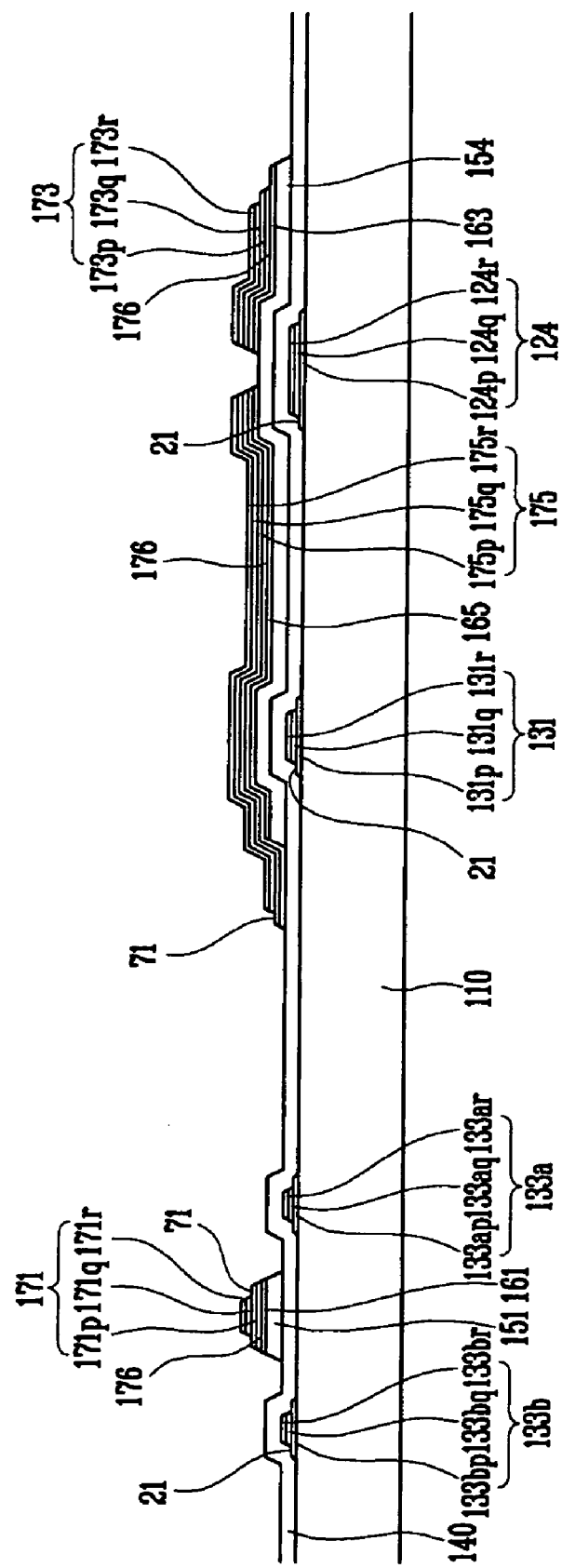
FIG. 16 and FIG. 17 are cross-sectional views of steps subsequent to FIG. 14 and FIG. 15, respectively.
Figure 17:
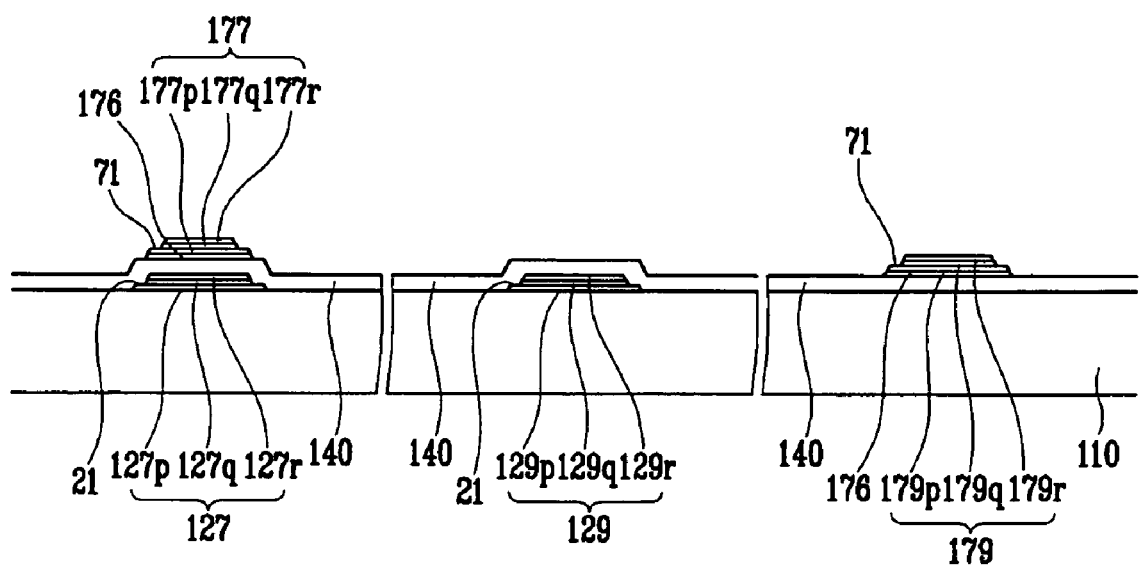

FIG. 5, FIG. 10, FIG. 13, and FIG. 18 are layout views sequentially showing a manufacturing method of a thin film transistor array panel according to an exemplary embodiment of the present invention. FIG. 6 and FIG. 7 are cross-sectional views of the thin film transistor array panel taken along a line VI-VI and a line VII-VII of FIG. 5, respectively, FIG. 8 and FIG. 9 are cross-sectional views of steps subsequent to FIG. 5 and FIG. 7, respectively, and FIG. 11 and FIG. 12 are cross-sectional views of the thin film transistor array panel taken along a line XI-XI and a line XII-XII of FIG. 10, respectively. FIG. 14 and FIG. 15 are cross-sectional views of the thin film transistor array panel taken along a line XIV-XIV and a line XV-XV of FIG. 13, respectively, FIG. 16 and FIG. 17 are cross-sectional views of steps subsequent to FIG. 14 and FIG. 15, respectively, and FIG. 19 and FIG. 20 are cross-sectional views of the thin film transistor array panel taken along a line XIV-XIV and a line XX-XX of FIG. 18, respectively.

A lower layer of aluminum (alloy), an intermediate layer of chromium, and an upper layer of chromium nitride are sequentially deposited on the insulation substrate 110 made of transparent glass or plastic, or the like.

Figure 5:
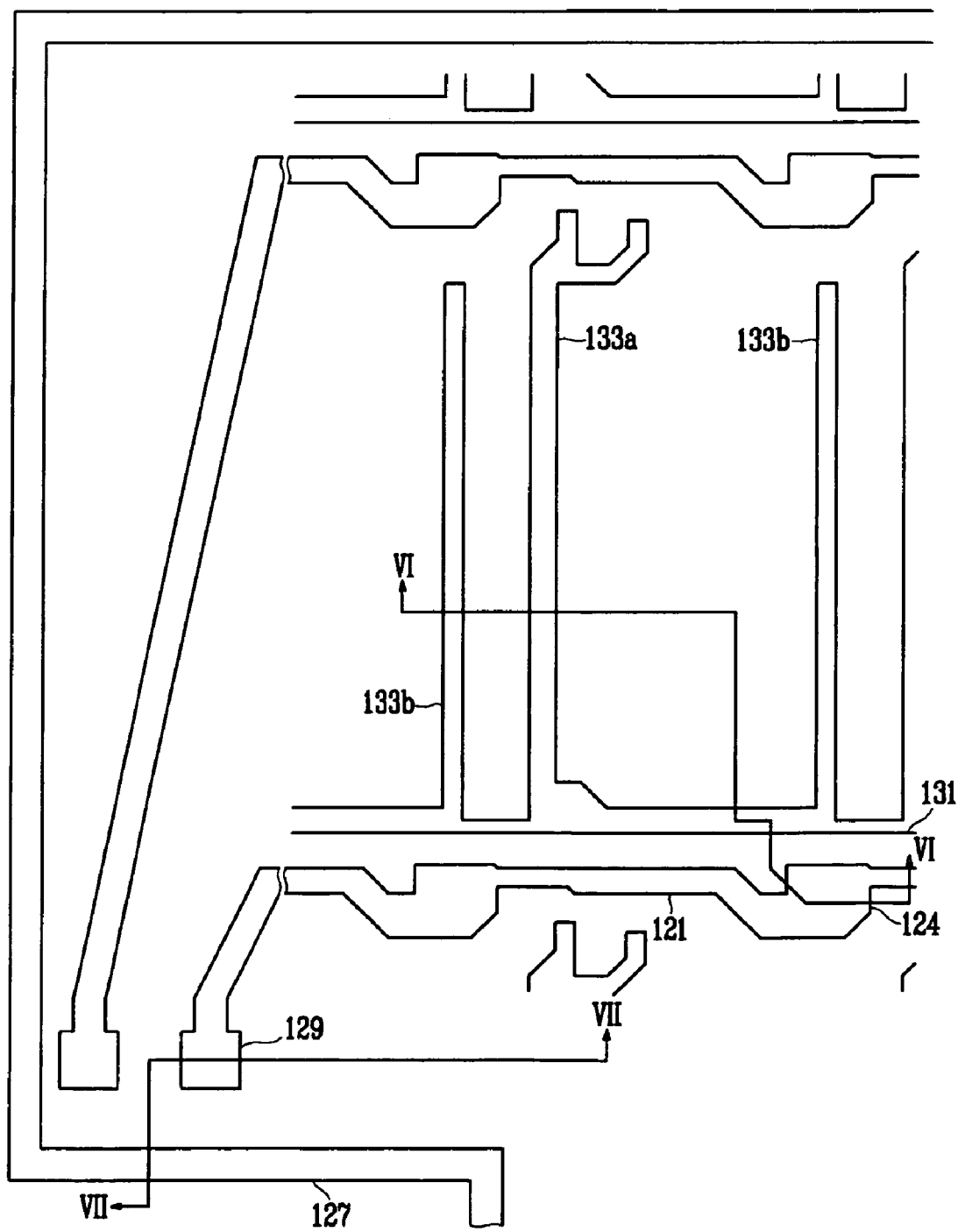
FIG. 5, FIG. 10, FIG. 13, and FIG. 18 are layout views sequentially showing a manufacturing method of a thin film transistor array panel according to an exemplary embodiment of the present invention.
Figure 6:
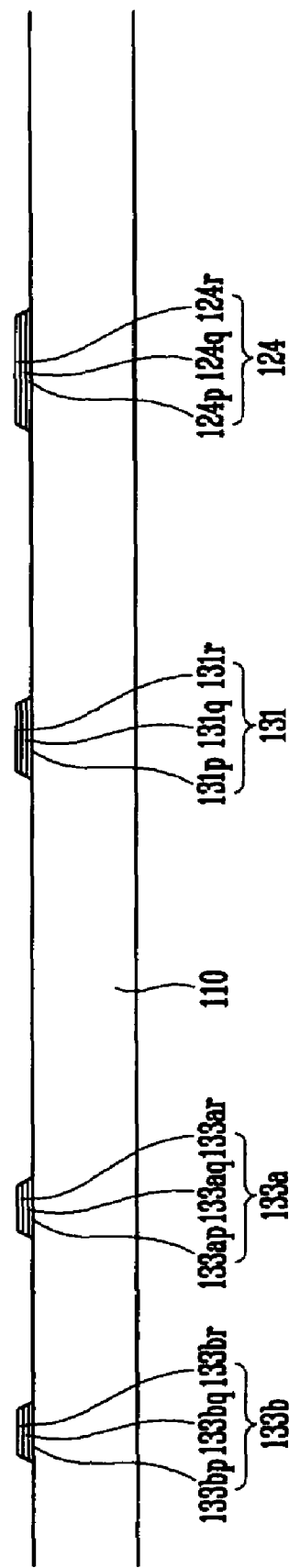
FIG. 6 and FIG. 7 are cross-sectional views of the thin film transistor array panel taken along a line VI-VI and a line VII-VII of FIG. 5, respectively.
Figure 7:
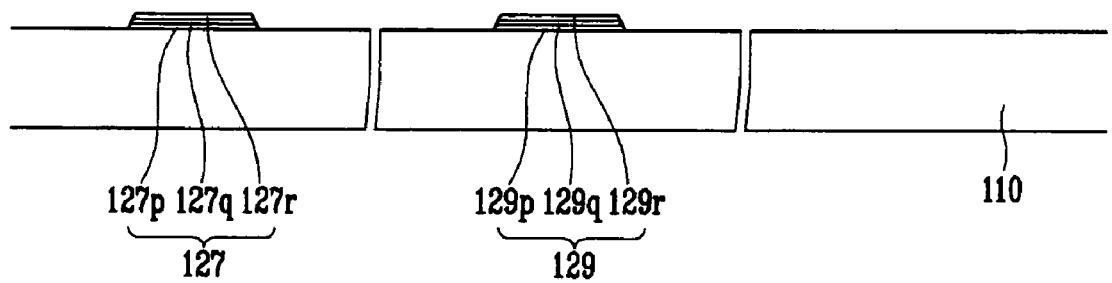

Subsequently, as shown in FIG. 5 to FIG. 7, first wet etching is performed to the upper and intermediate layers and second wet etching is performed to the lower layer, so as to form a plurality of gate lines 121 including gate electrodes 124 and end portions 129, a plurality of storage electrode lines 131 including storage electrodes 133a and 133b, and a plurality of first capacitor conductors 127.

Subsequently, as shown in FIG. 8 and in FIG. 9, third wet etching is performed on the sides of the upper and intermediate layers so as to expose portions 21 of the lower layers 124p, 131p, 133ap, 133bp, 127p, and 129p of the gate electrodes 124, the storage electrode lines 131, the storage electrodes 133a and 133b, the first capacitor conductors 127, and the end portion 129 of gate lines. This is to prevent an overhang phenomenon that may be caused by the lower layer being excessively etched by the second wet etching causing the width of the lower layer to become narrower than widths of the upper and intermediate layers. Accordingly, the widths of the upper and intermediate layers are made narrower than the width of the lower layer by the third wet etching.

Subsequently, on gate lines 121 and the storage electrode lines 131, the gate insulating layer 140 made of silicon nitride (SiNx) or the like, an intrinsic amorphous silicon a-Si layer that is not doped with an impurity, and an amorphous silicon n+ a-Si layer that is doped with an impurity are formed by a plasma enhanced chemical vapor deposition (PECVD) method.

Figure 10:
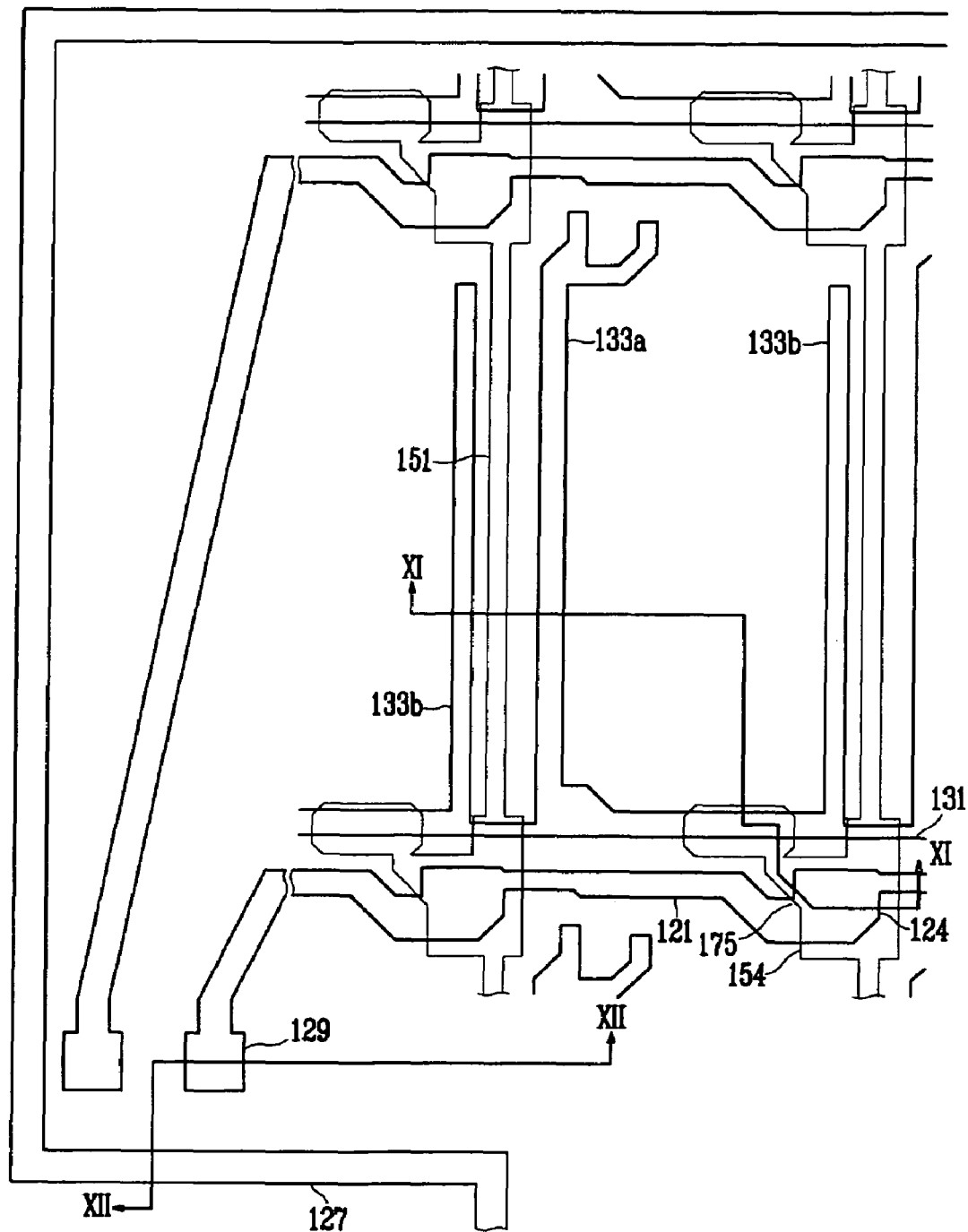
Figure 11:
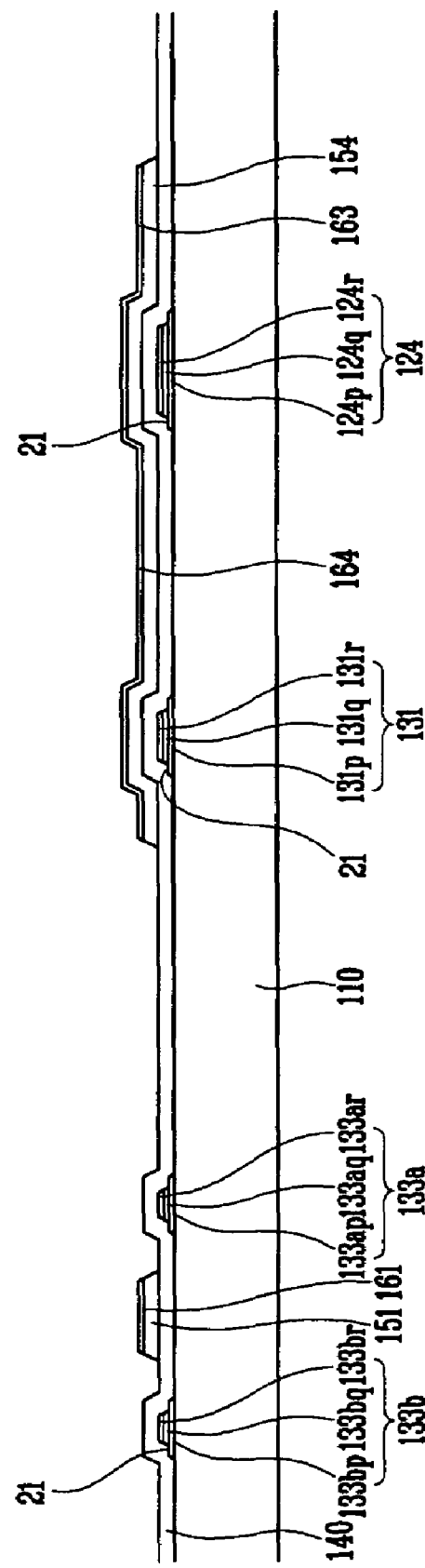
FIG. 11 and FIG. 12 are cross-sectional views of the thin film transistor array panel taken along a line XI-XI and a line XII-XII of FIG. 10, respectively.
Figure 12:
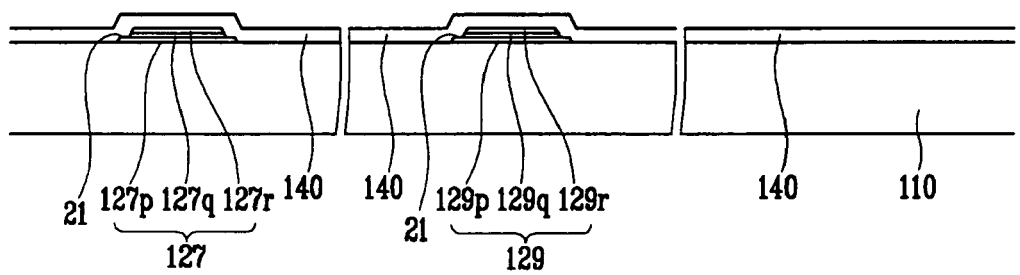

Subsequently, as shown in FIG. 10 to FIG. 12, a photolithography process is performed on the amorphous silicon doped with an impurity and the intrinsic amorphous silicon so as to form the gate insulating layer 140, the semiconductor stripe 151 including a plurality of protrusions 154, and the ohmic contact stripe 161 doped with an impurity including a plurality of impurity semiconductor patterns 164.

Subsequently, on ohmic contact stripe 161 doped with an impurity, the buffer layer 176 made of molybdenum (Mo), molybdenum tungsten (MoW), titanium (Ti), tungsten (W), nitrides MoNx, MoWNx, TiNx, and WNx thereof, and the like, is deposited. In addition, the lower layer of aluminum (alloy), the intermediate layer of chromium, and the upper layer of chromium nitride are sequentially deposited on the buffer layer.

Figure 13:
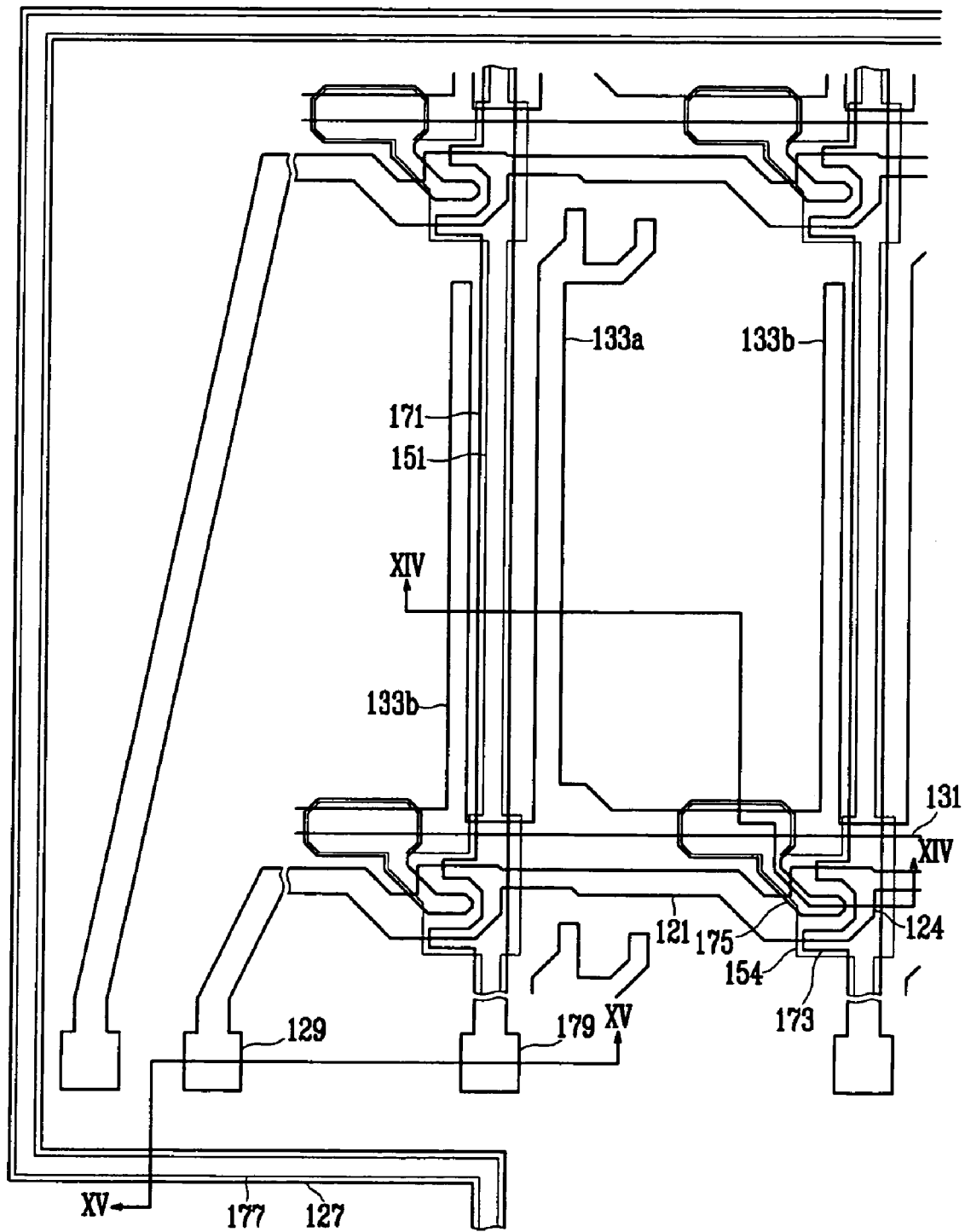
Figure 14:
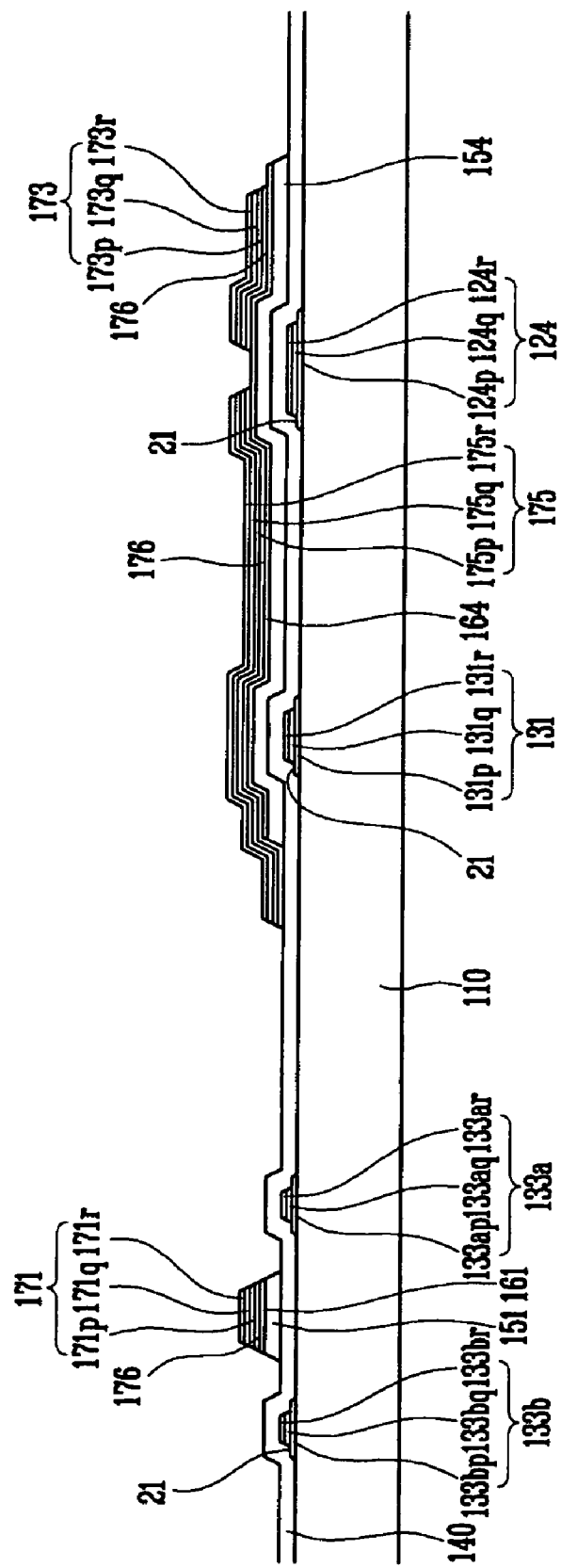
FIG. 14 and FIG. 15 are cross-sectional views of the thin film transistor array panel taken along a line XIV-XIV and a line XV-XV of FIG. 13, respectively.
Figure 15:
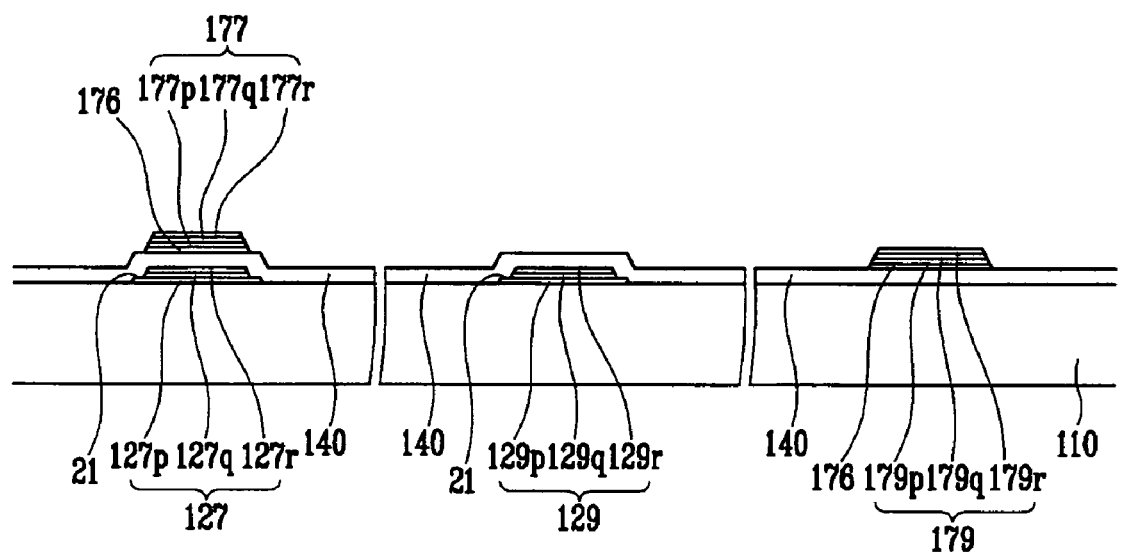

Subsequently, as shown in FIG. 13 to FIG. 15, first wet etching is performed on the upper and intermediate layers and a second wet etching is performed on the lower layer and the buffer layer, so as to form data lines 171 including source electrodes 173 and end portions 179, drain electrodes 175, and second capacitor conductors 177. At this time, since the buffer layer is made of molybdenum (Mo), molybdenum tungsten (MoW), titanium (Ti), tungsten (W), nitrides MoNx, MoWNx, TiNx, and WNx thereof, and the like, the buffer layer is etched by the second wet etching simultaneously with the lower layer.

Subsequently, as shown in FIG. 16 and FIG. 17, the sides of the upper and intermediate layers are partially etched by the third wet etching so as to expose the portions 71 of lower layers 173p, 179p, 171p, 175p, and 177p of data lines 171 including source electrodes 173 and end portions 179, drain electrodes 175, and second capacitor conductors 177. This is to prevent an overhang or an undercut caused by the lower layer being excessively etched by the second wet etching so that the width of the lower layer becomes narrower than widths of the upper and intermediate layers. Accordingly, the widths of the upper and intermediate layers are made narrower than the width of the lower layer by the third wet etching.

Subsequently, the exposed impurity semiconductor layer 164 that is not covered by the source electrodes 173 and the drain electrodes 175 is removed so as to not only form a plurality of ohmic contact stripes 161 including a plurality of protrusions 163 and a plurality of ohmic contact islands 165, but to also expose the protrusion 154.

Figure 18:
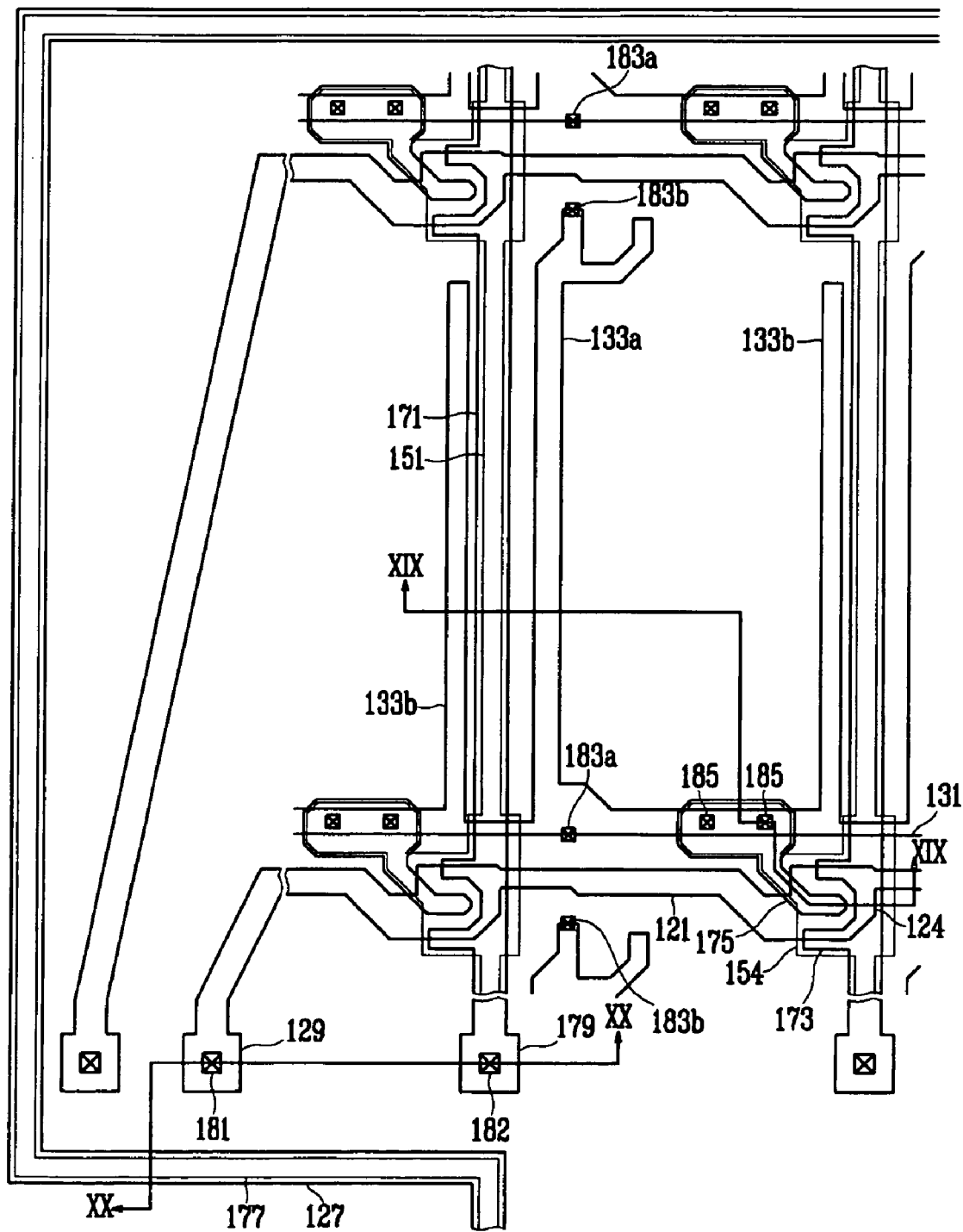
Figure 19:
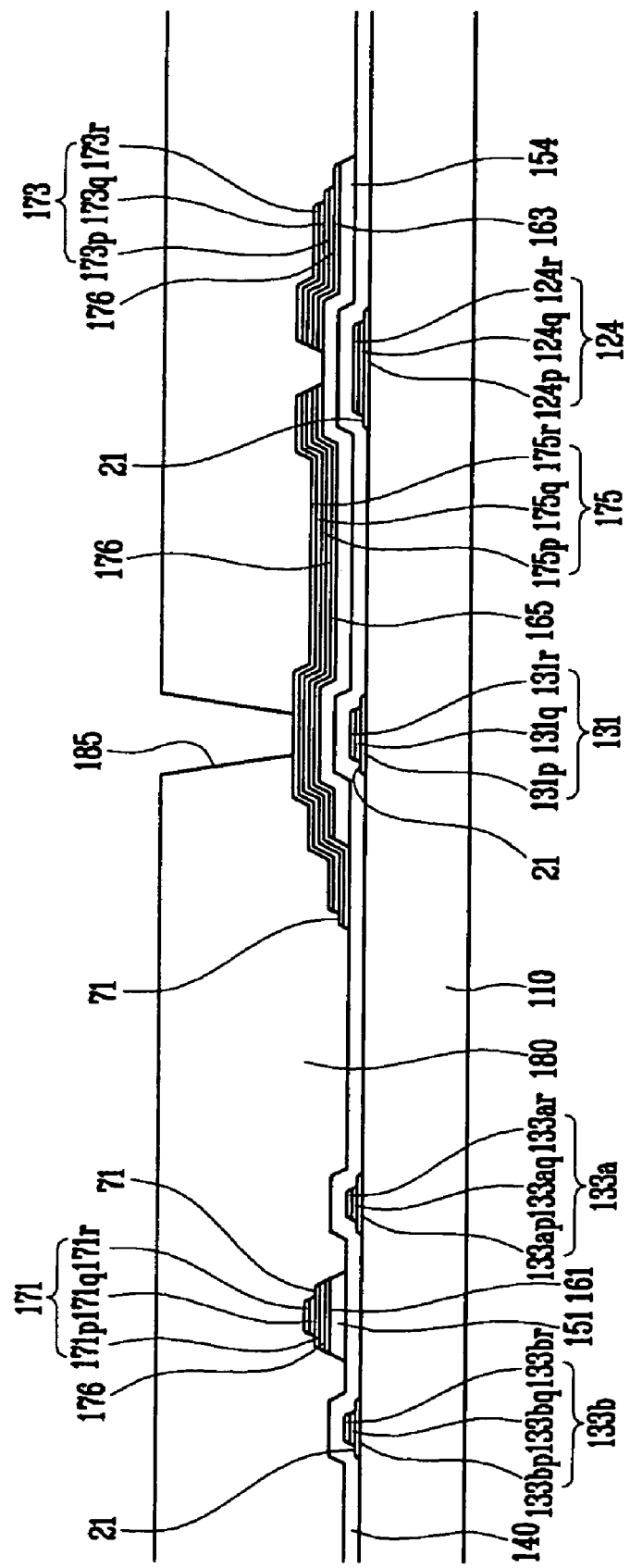
FIG. 19 and FIG. 20 are cross-sectional views of the thin film transistor array panel taken along a line XIV-XIV and a line XX-XX of FIG. 18, respectively.
Figure 20:
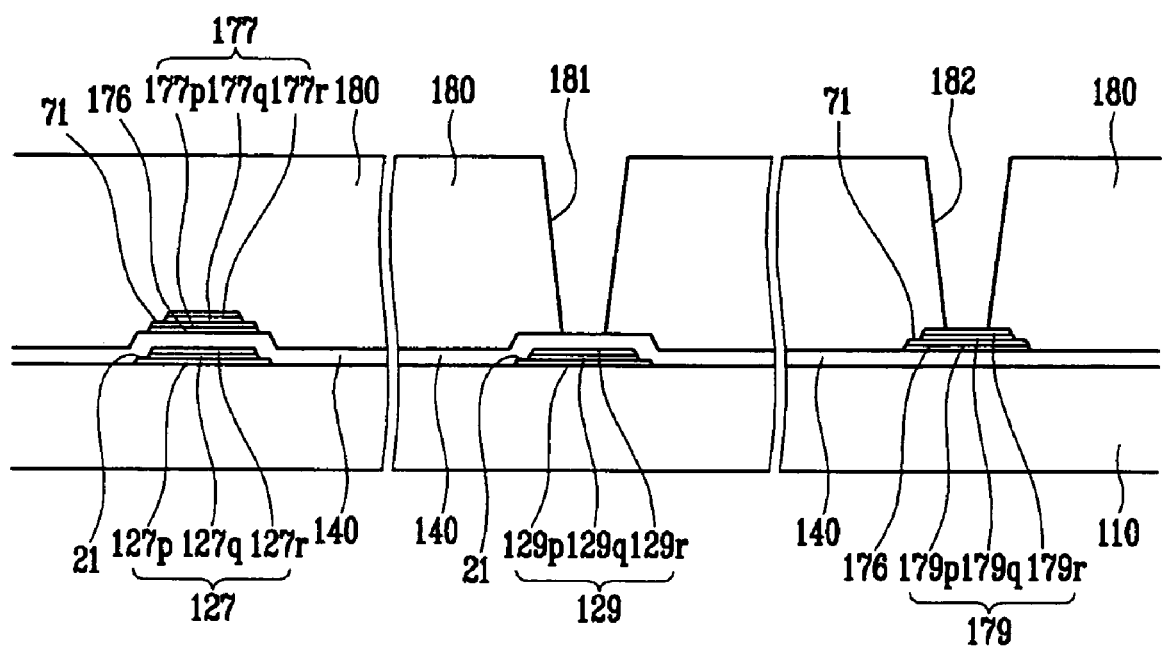

Subsequently, as shown in FIG. 18 to FIG. 20, passivation layer 180 is formed by depositing an organic material having an excellent planarization characteristic and photosensitivity, for example silicon nitride (SiNx) or the like, using a plasma enhanced chemical vapor deposition (PECVD) method.

Subsequently, a photosensitive film is coated on the passivation layer 180 and then light is directed to the photosensitive film through a photo mask and is developed so as to form a plurality of contact holes 181, 182, 183a, 183b, and 185.

Subsequently, as shown in FIG. 2 to FIG. 4, a transparent conductive layer such as an ITO layer is deposited by sputtering on the passivation layer 180, and is then patterned so as to form the pixel electrodes 191, the contact assistants 81 and 82, and the overpasses 83.

According to the thin film transistor array panel and the manufacturing method of the present invention, the driving capacitor, which has been formed on the FPC substrate in the prior art, is formed in a peripheral area of the thin film transistor array panel, so that the FPC can be formed as one layer and the size of the FPC can be substantially reduced so a slim and small-sized liquid crystal display can be produced.

In addition, since both the first and second capacitor conductors including the driving capacitor are formed by the lower layer of the aluminum alloy, the intermediate layer of chromium, and the upper layer of chromium nitride, the driving capacitor can maintain a constant voltage.

Furthermore, since portions of sides of the upper and intermediate layers of the gate line and the data line are again etched by the third wet etching so as to expose a portion of the lower layer, the overhang phenomenon which is caused by the lower layer being excessively etched by the second wet etching can be prevented so that a width of the lower layer becomes narrower than widths of the upper and intermediate layers.

Still furthermore, since the buffer layer is formed between the lower layer of the data line and the ohmic contact, the ohmic contact can be prevented from being damaged by the lower layer made of an aluminum group metal, and the contact resistance therebetween can be reduced.

While this invention has been described in connection with what is presently considered to be practical exemplary embodiments, it is to be understood that the invention is not limited to the disclosed embodiments, but, on the contrary, is intended to cover various modifications and equivalent arrangements that will be apparent to those skilled in the art without, however, departing from the spirit and scope of the invention.

What is claimed is:

1. A thin film transistor array panel, comprising:
an insulation substrate having a display area and a peripheral area;
a gate line formed on the insulation substrate;
a first capacitor conductor made of the same material as the gate line and formed in the peripheral area of the insulation substrate;
a gate insulating layer formed on the gate line and the first capacitor conductor;
a semiconductor layer formed on the gate insulating layer;
a data line and a drain electrode formed on the semiconductor layer and formed in the display area of the insulation substrate;
a second capacitor conductor formed of the same material as the data line and formed in the peripheral area of the insulation substrate; and
a pixel electrode connected to the drain electrode, said first capacitor conductor and said second capacitor conductor being formed to overlap each other.

2. The thin film transistor array panel of claim 1, further comprising an ohmic contact between the semiconductor layer and the data line.

3. The thin film transistor array panel of claim 1, wherein the first capacitor conductor comprises a lower layer, an intermediate layer, and an upper layer.

4. The thin film transistor array panel of claim 3, wherein the lower layer of the first capacitor conductor is an aluminum group metal including aluminum (Al).

5. The thin film transistor array panel of claim 3, wherein the intermediate layer of the first capacitor includes one of chromium (Cr), titanium (Ti), molybdenum (Mo(, and molybdenum-tungsten (MoW).

6. The thin film transistor array panel of claim 3, wherein the upper layer of the first capacitor conductor is a nitride of the intermediate layer.

7. The thin film transistor array panel of claim 3, wherein the upper layer of the first capacitor conductor includes one of chromium nitride (CrNx), titanium nitride (TiNx), molybdenum nitride (MoNx), and molybdenum-tungsten nitride (MoWNx).

8. The thin film transistor array panel of claim 1, wherein the second capacitor conductor comprises a lower layer, an intermediate layer, and an upper layer.

9. The thin film transistor array panel of claim 8, wherein the lower layer of the second capacitor conductor includes aluminum group metal including aluminum (Al).

10. The thin film transistor array panel of claim 8, wherein the second capacitor conductor includes one of chromium (Cr), titanium (Ti), molybdenum (Mo), and molybdenum-tungsten (MoW).

11. The thin film transistor array panel of claim 8, wherein the upper layer of the second capacitor conductor is a nitride of the intermediate layer.

12. The thin film transistor array panel of claim 8, wherein the upper layer of the second capacitor conductor includes one of chromium nitride (CrNx), titanium nitride (TiNx), molybdenum nitride (MoNx), and molybdenum-tungsten nitride (MoWNx).

13. The thin film transistor array panel of claim 1, wherein a buffer layer is formed between the semiconductor layer and the second capacitor conductor.

14. The thin film transistor array panel of claim 13, wherein the buffer layer includes one of molybdenum (Mo), molybdenum tungsten (MoW,) titanium (Ti), tungsten (W), molybdenum nitride (MoNx), molybdenum-tungsten nitride (MoWNx), titanium nitride (TiNx), and tungsten nitride (WNx).

15. The thin film transistor array panel of claim 1, wherein side surfaces of the first capacitor conductor and the second capacitor conductor is slanted by about 30 to 80 degrees with respect to a surface of the substrate.

16. The thin film transistor array panel of claim 1, wherein line resistances of the first capacitor conductor and the second capacitor conductor are low to maintain a voltage difference between a gate-on voltage and a gate-off voltage.

17. A manufacturing method of a thin film transistor array panel, comprising:
- forming a gate line and a first capacitor conductor on an insulation substrate including a display area and a peripheral area;
- forming a gate insulating layer on the gate line and the first capacitor conductor;
- forming a semiconductor layer on the gate insulating layer;
- forming a data line, a drain electrode, and a second capacitor conductor on the semiconductor layer, said first capacitor conductor and the second capacitor conductor being formed in the peripheral area of the insulation substrate to overlap each other; and
- forming a pixel electrode connected to the drain electrode.

18. The manufacturing method of claim 17, wherein the forming of the gate line and the first capacitor conductor comprises:
- sequentially depositing a lower layer, an intermediate layer, and an upper layer on the insulation substrate;
- performing first etching to the upper layer and the intermediate layer;
- performing second etching to the lower layer; and
- performing third etching to the upper layer and the intermediate layer such that widths of the upper layer and the intermediate layer become narrower than a width of the lower layer.

19. The manufacturing method of claim 18, wherein:
- the lower layer of the first capacitor conductor is an aluminum group metal including aluminum (Al);
- the intermediate layer of the first capacitor conductor includes one of chromium (Cr), titanium (Ti), molybdenum (Mo), and molybdenum-tungsten (MoW); and
- the upper layer of the first capacitor conductor is made of a nitride of the intermediate layer.

20. The manufacturing method of claim 17, wherein the forming of the data line and the second capacitor conductor comprises:
- depositing a lower layer, an intermediate layer, and an upper layer on the semiconductor layer;
- performing first etching to the upper layer and the intermediate layer;
- performing second etching to the lower layer; and
- performing third etching to the upper layer and the intermediate layer such that widths of the upper layer and the intermediate layer become narrower than a width of the lower layer.

21. The manufacturing method of claim 20, wherein:
- the lower layer of the second capacitor conductor is aluminum group metal including aluminum (Al);
- the intermediate layer of the second capacitor conductor includes one of chromium (Cr), titanium (Ti), molybdenum (Mo), molybdenum-tungsten (MoW); and
- the upper layer of the second capacitor conductor is made of a nitride of the intermediate layer.

22. The manufacturing method of claim 18 or claim 20, further comprising forming a buffer layer on the semiconductor layer.

23. The manufacturing method of claim 20, wherein the buffer layer is etched simultaneously with the lower layer of the second capacitor conductor.

* * * * *